United States Patent [19]

Yoo

[11] Patent Number: 5,089,432
[45] Date of Patent: Feb. 18, 1992

[54] POLYCIDE GATE MOSFET PROCESS FOR INTEGRATED CIRCUITS

[75] Inventor: Chue-San Yoo, Hsin-Chuang, Taipei, Taiwan

[73] Assignee: Taiwan Semiconductor Manufacturing Company, Hsinchu, Taiwan

[21] Appl. No.: 568,948

[22] Filed: Aug. 17, 1990

[51] Int. Cl.⁵ .......................................... H01L 21/264
[52] U.S. Cl. ........................................ 437/40; 437/41; 437/44; 437/34
[58] Field of Search ......................... 437/44, 41, 40, 34

[56] References Cited

U.S. PATENT DOCUMENTS

| | | | |
|---|---|---|---|
| 4,577,391 | 3/1986 | Hsia et al. | 437/44 |
| 4,690,730 | 9/1987 | Tang et al. | |
| 4,774,201 | 9/1988 | Woo et al. | 437/41 |
| 4,994,404 | 2/1991 | Sheng et al. | 437/44 |

FOREIGN PATENT DOCUMENTS 56-157024 12/1981 Japan .
61-214472 9/1986 Japan .

Primary Examiner—Brian E. Hearn
Assistant Examiner—Laura M. Holtzman
Attorney, Agent, or Firm—George O. Saile

[57] ABSTRACT

A method for fabricating a lightly doped drain MOSFET integrated circuit device which overcomes the problems in prior ICs. The method begins by forming a pattern of gate electrode structures upon a semiconductor substrate which structures each includes a gate oxide, a polysilicon layer and an amorphous refractory metal silicide. The resulting structure may be annealed in oxygen at this time to change the refractory metal silicide from it deposited amorphous phase into its crystalline phase. A pattern of lightly doped regions in the substrate is formed by ion implantation using the polycide gate structures as the mask. A dielectric layer is blanket deposited over the surfaces. This layer is planned to form both the spacers and a cover layer for the refractory metal silicide layer. This is done by forming a lithography mask by conventional lithography and etching on the blanket layer and over the pattern of polycide gate electrode structures. RIE forms the spacer structure upon the sidewalls of each of the polycide gate structures and the cover layer. The lithography mask is removed. A pattern of heavily doped regions in the substrate is formed by ion implantation using the polycide structures with spacer structures as the mask to produce the lightly doped drain source/drain structures of an MOSFET device. The IC is completed by forming appropriate passivation/conductor layers to connect the elements.

13 Claims, 1 Drawing Sheet

POLYCIDE GATE MOSFET PROCESS FOR INTEGRATED CIRCUITS

BACKGROUND OF THE INVENTION (1) Field of the Invention

The present invention relates to methods for producing integrated circuit devices having lightly doped drain MOSFET with refractory metal polycide gate structures.

(2) Description of Prior Art

The use of polycide gates or interconnect lines, that is a combination of layers of polysilicon and a refractory metal silicide is becoming very important as the industry moves to smaller device geometries. In the past, polysilicon was satisfactory as the gate electrodes and for interconnecting lines. However, as these geometries become smaller, polysilicon has become too high in resistivity for these applications due to its affect on RC time delays and IR voltage drops. The use of a combination of refractory metal silicides with polysilicon has proven suitable because of its lower resistivity.

Silicides of certain refractory metals, i.e. tungsten, molybdenum, titanium, and tantalum have been proven to be suitable for use as a low resistance interconnect material for VLSI integrated circuit fabrication. The disilicides pair very well with heavily doped polysilicon to form polycide gates, because of the criteria of low resistivity and high temperature stability. Tungsten silicide has particularly been found to be capable of overcoming some shortcomings, such as self-passivation, good stability in wet chemical ambients, adhesion, and reproducibility in combination with polysilicon in production.

The preferred deposition technique of tungsten silicide is low pressure chemical vapor deposition. The oxidation characteristics of tungsten silicide as produced by this method are similar to those of polysilicon.

The peeling of the polycide film can happen frequently if care is not taken during processing and handling of the wafers. This in turn causes the low yield of the product. This peeling and/or less integrity of the silicide problems are often observed after thermal treatments.

The conventional polycide process forms sequentially the gate oxide layer by thermal oxidation, the polysilicon layer which is then doped, and the refractory metal silicide in situ. The refractory metal silicide and polysilicon layer deposition and the doping of the polysilicon are normally not done in the same reaction chamber. These layers are now anisotropically etched in the desired pattern of polycide gate structures. An annealing step in oxygen causes the amorphous refractory metal silicide to change into its crystalline phase. During this annealing process, silicon dioxide is grown upon the surfaces of the polycide and exposed silicon substrate. A pattern of lightly doped regions in the substrate is form by ion implantation using said gate electrode structures as the mask. The dielectric spacer is formed by blanket chemical vapor deposition of silicon dioxide, a heat densification step and an anisotropic etching of the silicon dioxide layer. The result of this process is all too often the peeling of the refractory metal silicide.

The workers in the field have tried to overcome this problem by capping with silicon dioxide during the reaction of titanium with the underlying polysilicon layer such as shown by T. E. Tang et al in U.S. Pat. No. 4,690,730. This did suppress peeling for this type of process, however the major reason for the silicon dioxide layer is to prevent the titanium from being oxidized by oxygen.

It is therefore an important object of this invention to provide a method for fabricating integrated circuits which overcomes this peeling problem and raises yields.

SUMMARY OF THE INVENTION

In accordance with the present invention, a method is described for fabricating a lightly doped drain MOSFET integrated circuit device which overcomes the problems described above in prior integrated circuit devices. The method begins by forming a pattern of gate electrode structures upon a semiconductor substrate which structures each includes a gate oxide, a polysilicon layer and an amorphous refractory metal silicide. The resulting structure may be annealed in oxygen at this time to change the refractory metal silicide from it deposited amorphous phase into its crystalline phase. A pattern of lightly doped regions in the substrate is formed by ion implantation using the polycide gate structures as the mask. A dielectric layer is blanket deposited over the surfaces. This layer is planned to form both the spacers and a cover layer for the refractory metal silicide layer. This is done by forming a lithography mask by conventional lithography and etching techniques on the blanket layer and over the pattern of polycide gate electrode structures. Reactive ion anisotropic etching forms the spacer structure upon the sidewalls of each of the polycide gate structures and over the adjacent portions of the substrate and the cover layer. The lithography mask is removed. A pattern of heavily doped regions in the substrate is formed by ion implantation using the polycide structures with spacer structures as the mask to produce the lightly doped drain source/drain structures of an MOSFET device. The integrated circuit device is completed by forming a passivation layer over the structures described and appropriate electrical connecting structures thereover to electrically connect the gate electrode structures and source/drain elements.

Also in accordance with the present invention, there is the resulting integrated circuit device structure that is formed by the method described above. This lightly doped drain MOS FET integrated circuit device includes a pattern of gate electrode structures upon a semiconductor substrate which structures each includes a gate oxide, a polysilicon layer and a crystalline refractory metal silicide layer. A pattern of lightly doped regions is located in the substrate adjacent to the structures. A dielectric spacer structure is located upon the sidewalls of each of the polycide structures and over the adjacent portions of the substrate. This spacer layer is formed of the same material as the silicon dioxide cover layer over the polycide structure, since they both come from the same layer that had been otherwise etched away. A pattern of heavily doped regions is located in the substrate adjacent to the spacer structure on the sidewalls of the polycide structures and this heavily doped pattern overlaps in part the lightly doped pattern. This pattern forms the lightly doped drain source/drain structures of an MOS FET device. Appropriate passivation and electrical connecting structures are formed thereover to electrically connect the gate electrode structure and source/drain elements.

DESCRIPTION OF THE PREFERRED EMBODIMENTS

Referring now more particularly to FIGS. 1 through 4, there is shown a method for making the lightly doped drain device of the present invention. The first series of steps involve the formation of the dielectric isolation regions for isolating semiconductor surface regions from other such regions in the semiconductor substrate 11. The semiconductor substrate is preferably composed of silicon having a (100) crystallographic orientation. In an effort to simplify the description and the drawings the dielectric isolation between devices have not been shown and will not be described, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide. Then semiconductor devices can be provided in the silicon mesas according to the following processes.

The surface of the silicon substrate 11 is thermally oxidized to form the desired gate oxide 12 thickness. The preferred thickness is between about 0.225 to 0.275 micrometers. The polysilicon layer 14 is blanket deposited by pyrolyzing silane between about 575° and 650° C. as is conventionally done. The preferred thickness of the polysilicon layer 14 is between about 0.125 to 0.275 micrometers. The polysilicon layer 14 is doped with POCl under the conditions of 850° C. for about 10 minutes of a soaking and 30 minutes of a drivein. The resulting surface is cleaned in a standard cleaning solution for polysilicon.

Figure 1:
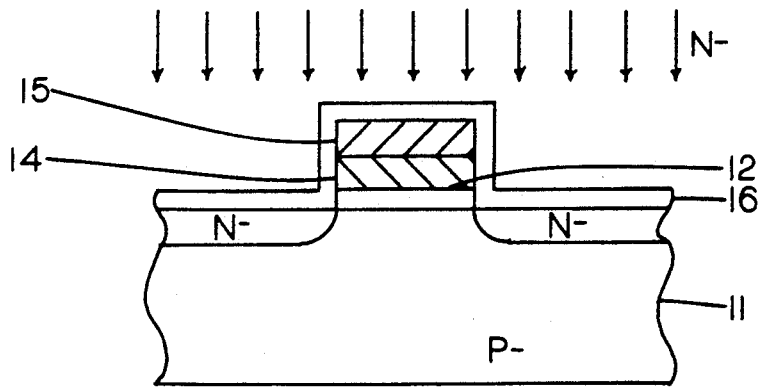
FIG. 1 through FIG. 4 schematically illustrate the method for making a lightly doped drain MOS FET polycide gate integrated circuit of the invention.

An amorphous refractory metal silicide layer 15 is deposited using low pressure chemical vapor deposition over the polysilicon layer 14 to produce the FIG. 1 structure. The amorphous layer 15 has a chemical formula of $MSi_x$ where M is the refractory metal and x is between 2.6 to 2.7. It is desirable to have x in this range for diminishing film stress.

The preferred metal silicide is tungsten silicide and the preferred deposition conditions are a gas flow of tungsten fluoride and silane at a temperature of about 360° C. and pressure of about 200 mTorr. in a suitable reactor. The flow rate of the silane is preferred to be about 2000 sccm. The thickness of the metal silicide is between about 0.225 to 0.275 micrometers and the preferred thickness is 0.25 micrometers. Conventional lithography and etching is now used to form a lithographic mask over the polycide layered structure. The mask pattern protects the designated areas to by the polycide gate structures. The masked structure is now exposed to a plasma etching ambient of for example, $SF_6/C_2F_6$ under a pressure of about 250 mtorr. to remove the unwanted portions of the polysilicon layer 14 and refractory metal silicide layer 15.

The resulting polycide structure is thermally oxidized at this stage of the process and which will cause the crystallization of the refractory metal silicide. The oxidizing temperature is less than about 950° C. and preferably about 920° C. for about 30 minutes or less. The silicon oxide 16 that is formed upon the polycide structures 14, 15 is about 400 Angstroms and about 150 Angstroms on the exposed silicon substrate 11. This silicon oxide is left on the polycide top surface until the subsequent spacer etching which is often a 25% overetching step. The overetching will then remove this oxide layer. Thereafter the bare oxidized silicide is exposed to the oxidizing or annealing ambients.

Figure 2:
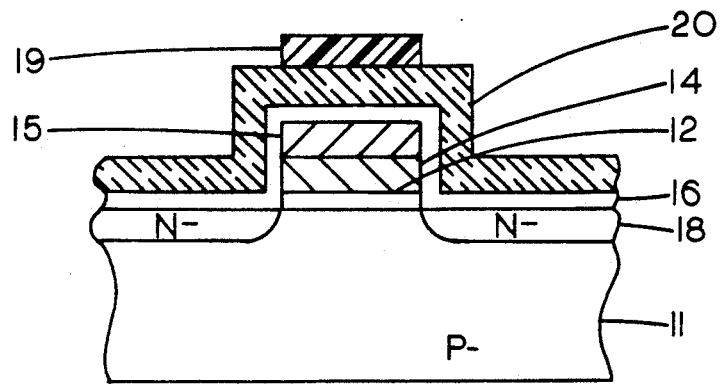
Figure 3:
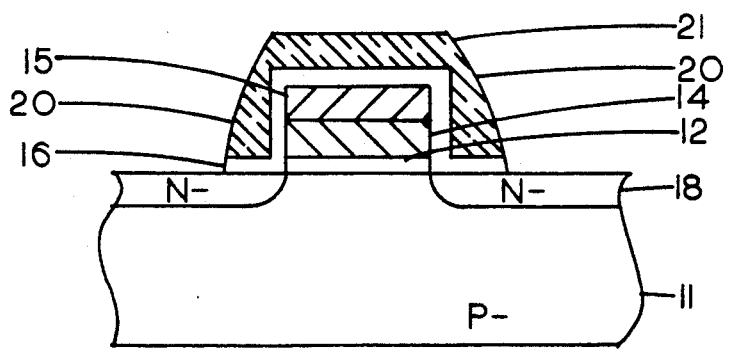
Figure 4:
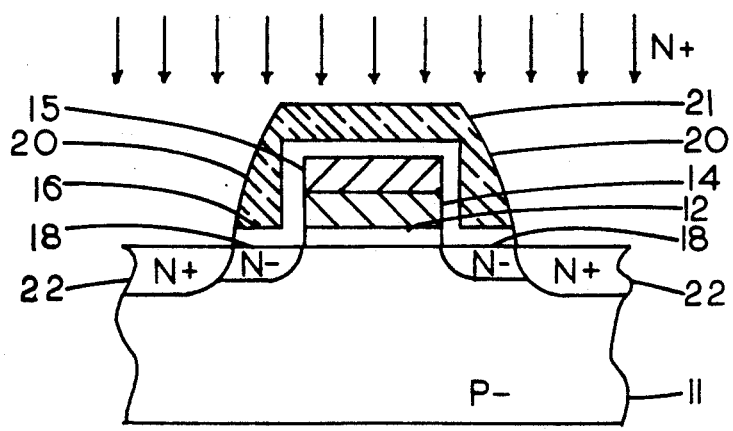

The source/drain structure of the MOS FET may now formed by the following steps. The FIGS. 2 through 4 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. Of course, it may be desirable to form N or P wells as is known in the art in making such CMOS FET integrated circuit devices.

FIG. 2, for example shows the ion implantations of N-dopants. Lithographic masks (not shown) may be required to protect the areas not to be subjected to that particular N-ion implantation. The formation of the lithographic masks are done by conventional lithography and etching techniques. The N-lightly doped drain implantation 18 is done with for example phosphorous P31 at a dose of $2 \times 10^{-13}$ square cm. and with an energy of 75 Kev. The N-regions may be driven in using a thermal cycle in oxygen at less than about 950° C. and preferably 920° C. for 20 minutes.

The dielectric spacer 20 and cover layer 21 are now to be formed followed by the completion of the lightly doped drain source/drain structures and may be better understood with reference to FIGS. 2 through 4. A low temperature silicon dioxide deposition is preferred such as through the chemical vapor deposition of tetraethoxysilane (TEOS) at a temperature in the range of between about 650° to 750° C. However, it is generally preferred to have the spacer and cover layer formation layer at the 700° C. The thickness of the dielectric silicon dioxide layer is between about 2250 to 2750 Angstrom and preferably 2500 Angstroms.

It is now necessary to form a lithographic mask 19 upon the surface of the TEOS silicon dioxide layer formed over the surface of the structure. This mask is identical to the mask that is used to pattern the polycide layer, therefore there is no additional mask cost. The location of the areas to be masked is over the refractory metal silicide layer 15 in the polycide structures. The layer may be formed by conventional lithography and etching processes as are known in the art.

An anisotropic etching of this layer produces the dielectric spacer layer 20 on the sidewalls of the polycide structures 14, 15 and the cover layer 21 over the refractory metal silicide layer 15. The preferred anisotropic etching uses a plasma dry etching apparatus with carbon hydrogen trifluoride and helium gases to etch the layer of silicon dioxide at a pressure of about 3 Torr.

The exposed silicon oxide layer 16 is also removed along with the unwanted portions of layer 20 by the reactive ion etching as can be seen by the FIG. 3. The lithographic mask 19 is removed by, for example plasma ashing in oxygen as is well known in the art.

Referring now to FIG. 4, the N+ source/drain ion implantation uses, for example Arsenic, As75 with a dose of $5 \times 10^{-15}$ square cm. and energy of about 140 Kev. to complete the source/drain regions 22 of the N channel lightly doped drain MOS FET integrated circuits device.

The passivation layer (not shown) is now deposited over the upper surfaces of the FIG. 4 structure. The appropriate connections now have to be made to electrically connect the various gate electrodes and source/drain elements to form the integrated circuit device. The contact (not shown) to the source/drain elements requires a contact etching step that forms openings to the source/drain elements through the passivation layer.

Appropriate metallurgy (not shown) is now deposited and patterned to electrically connect the gates and source/drain elements to form the integrated circuit device. This metallurgy is conventional and may be formed of polysilicon, aluminum, aluminium with dopants of copper and/or silicon, polycide and the like.

While the invention has been particularly shown and described with reference to the preferred embodiments, it will be understood by those skilled in the art that various changes in form and details may be made without departing from the spirit and scope of the invention. For example, while the detailed examples of the integrated circuit devices used N channel MOS FET devices, it is obvious to those skilled in the art that P channel devices and CMOS FET devices can also be fabricated as part of this invention. Further, bipolar devices can also be added to the integrated circuit device to form BIMOS or BICMOS structures.

What is claimed is:

1. The method for fabricating a lightly doped drain MOS FET integrated circuit device comprising:
   forming a pattern of gate electrode structures upon a semiconductor substrate which structures each includes a gate oxide, a polysilicon layer and an amorphous refractory metal silicide;
   forming a pattern of lightly doped regions in said substrate by ion implantation using said structures as the mask;
   blanket depositing a low temperature silicon dioxide layer over the surfaces of the structure;
   lithographically forming a mask over each refractory metal silicide of said pattern of gate electrode structure;
   etching the said blanket layer to form a dielectric spacer structure upon the sidewalls of each of said structures and over the adjacent portions of said substrate, and a cover silicon dioxide layer over said each refractory metal silicide structure;
   removing the said mask over each refractory metal silicide of said pattern leaving said cover layer in tact;
   wherein the mask that is used to form the said pattern of gate electrode structures is the same mask used to form the said cover layer and dielectric spacer structure;
   forming a pattern of heavily doped regions in said substrate by ion implantation using the said structures with spacer structures as the mask to produce the lightly doped drain source/drain structures of an MOS FET device; and
   forming a passivation layer over the said structures and appropriate electrical connecting structures thereover to electrically connect the said gate electrode structures and source/drain elements to form said integrated circuit device.

2. The method of claim 1 wherein the said refractory metal silicide is deposited in situ by chemical vapor deposition.

3. The method of claim 2 wherein the said refractory metal silicide is tungsten disilicide.

4. The method of claim 1 wherein the thickness of the said refractory metal silicide is between about 2250 to 2750 Angstroms, the said polysilicon layer is heavily doped and the thickness of said polysilicon layer is between about 2250 to 2750 Angstroms.

5. The method of claim 1 wherein the said lightly doped regions are N-doped and said heavily doped regions are N+ doped to form N channel MOS FET integrated circuit.

6. The method of claim 1 wherein both P and N lightly doped drain MOS FET integrated circuit devices are formed on said substrate to provide CMOS FET circuit capability within said integrated circuit device.

7. The method of claim 1 wherein the thickness of said thin silicon dioxide spacer and cover layer is between about 2250 to 2750 Angstroms, and the said spacer and cover layer is formed by low temperature chemical vapor deposition at less than 670° C.

8. The method of claim 3 wherein the thickness of said tungsten disilicide layer is between about 2250 and 2750 Angstroms and the thickness of the said polysilicon layer is between about 2250 and 2750 Angstroms.

9. The method of claim 1 wherein the said dielectric spacer structure is formed with a low temperature TEOS chemical vapor deposition method and an reactive ion anisotropic etching process to produce a said silicon dioxide spacer and cover layer.

10. The method of claim 1 wherein after the formation of the pattern of gate electrode structures, the structure is annealed in an oxygen atmosphere to transform the said refractory metal silicide from its amorphous phase to its crystalline phase.

11. The method for fabricating a lightly doped drain MOS FET integrated circuit device comprising:
    forming a pattern of gate electrode structures upon a semiconductor substrate which structures each includes a gate oxide, a polysilicon layer and an amorphous tungsten disilicide;
    annealing the said pattern of gate electrode structures in an oxygen atmosphere to transform the said tungsten disilicide from its amorphous phase to its crystalline phase;
    forming a pattern of lightly doped regions in said substrate by ion implantation using said structures as the mask;
    blanket depositing a low temperature silicon dioxide layer over the surfaces of the structure;
    lithographically forming a mask over each tungsten disilicide of said pattern of gate electrode structure;
    etching the said blanket layer to form a dielectric spacer structure upon the sidewalls of each of said structures and over the adjacent portions of said substrate, and a cover silicon dioxide layer over said each tungsten disilicide structure;
    removing the said mask over each tungsten disilicide layer of said pattern leaving said cover layer in tact; wherein the mask that is used to form the said pattern of gate electrode structures is the same mask used to form the said cover layer and dielectric spacer structure;

forming a pattern of heavily doped regions in said substrate by ion implantation using the said structures with spacer structures as the mask to produce the lightly doped drain source/drain structures of an MOS FET device; and forming a passivation layer over the said structures and appropriate electrical connecting structures thereover to electrically connect the said gate electrode structures and source/drain elements to form said integrated circuit device.

12. The method of claim 11 wherein the said tungsten disilicide has a thickness of between about 2250 to 2750 Angstroms and the said annealing is done at a temperature of less than 920° C. for less than 30 minutes.

13. The method of claim 11 wherein the said dielectric spacer structure is formed with a low temperature TEOS chemical vapor deposition method and an reactive ion anisotropic etching process to produce a silicon dioxide spacer and cover layer.

* * * * *